(12) United States Patent
Cha

(10) Patent No.: US 11,984,299 B2
(45) Date of Patent: May 14, 2024

(54) DEPOSITION DEVICE APPARATUS

(71) Applicant: SAMSUNG DISPLAY CO., LTD., Yongin-si (KR)

(72) Inventor: Youngsik Cha, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 353 days.

(21) Appl. No.: 17/321,723

(22) Filed: May 17, 2021

(65) Prior Publication Data

US 2022/0076926 A1 Mar. 10, 2022

(30) Foreign Application Priority Data

Sep. 4, 2020 (KR) .................. 10-2020-0113383

(51) Int. Cl.
 *H01J 37/32* (2006.01)
(52) U.S. Cl.
 CPC .. *H01J 37/32477* (2013.01); *H01J 37/32715* (2013.01); *H01J 37/32862* (2013.01)
(58) Field of Classification Search
 USPC ................................................ 118/715, 728
 See application file for complete search history.

(56) References Cited

FOREIGN PATENT DOCUMENTS

| | | | | |
|---|---|---|---|---|
| CN | 101298670 A | * | 11/2008 | ......... C23C 16/4585 |
| JP | 2012-028682 | | 2/2012 | |
| KR | 10-2010-0090675 | | 8/2010 | |
| KR | 10-2011-0063049 | | 6/2011 | |
| KR | 10-2018-0130642 | | 12/2018 | |
| WO | WO-2020222764 A1 | * | 11/2020 | ......... C23C 16/4586 |

OTHER PUBLICATIONS

English Translation CN-101298670 (Year: 2008).*

* cited by examiner

*Primary Examiner* — Yewebdar T Tadesse
(74) *Attorney, Agent, or Firm* — F. CHAU & ASSOCIATES, LLC

(57) ABSTRACT

A deposition device includes a chamber, a support member, a ground member, and a first fixing member. The chamber includes a lower portion and a side wall. The support member is located in a space defined by the lower portion and the side wall of the chamber, and includes a side surface. The ground member is disposed between the support member and the lower portion of the chamber. The first fixing member includes a first body and a first blocking part. The first body is located under a first end portion of the ground member, and includes a side surface. The first blocking part is located on the side surface of the first body and the side surface of the support member, and extends along the side surface of the support member. The first blocking part shields the first end portion of the ground member from view.

20 Claims, 13 Drawing Sheets

FIG. 4
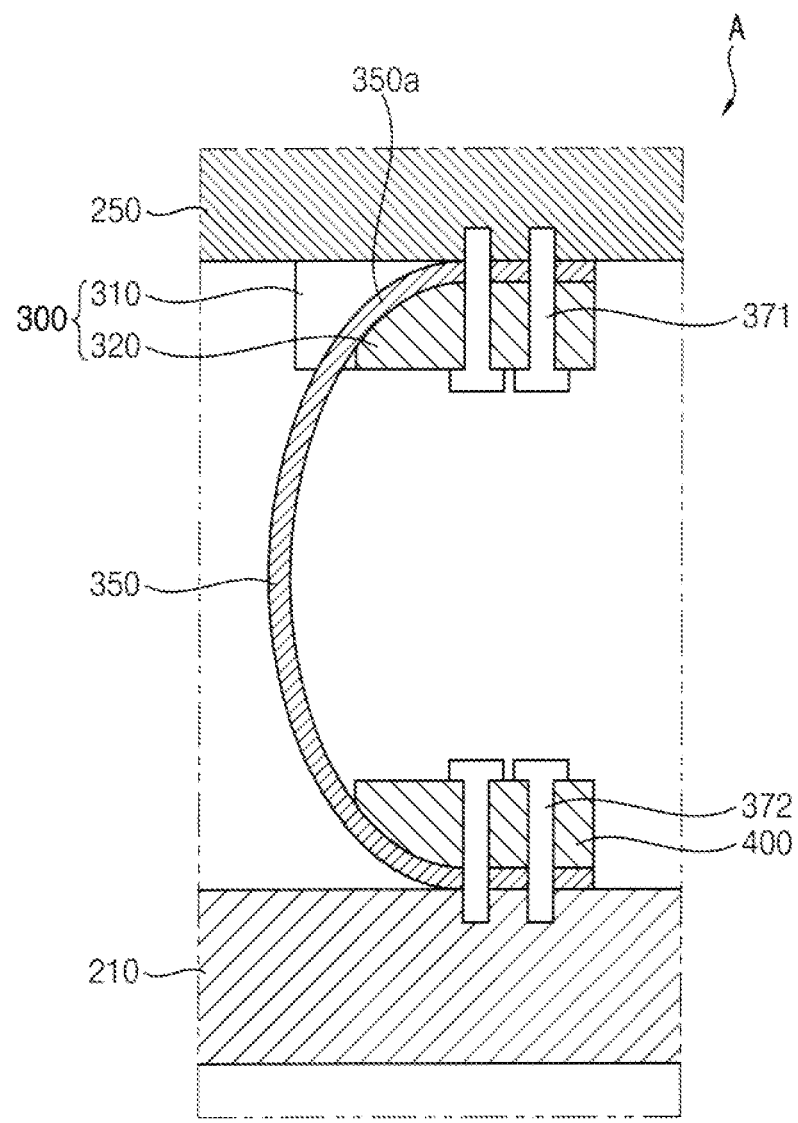
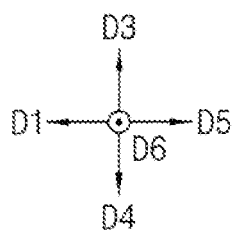

FIG. 7
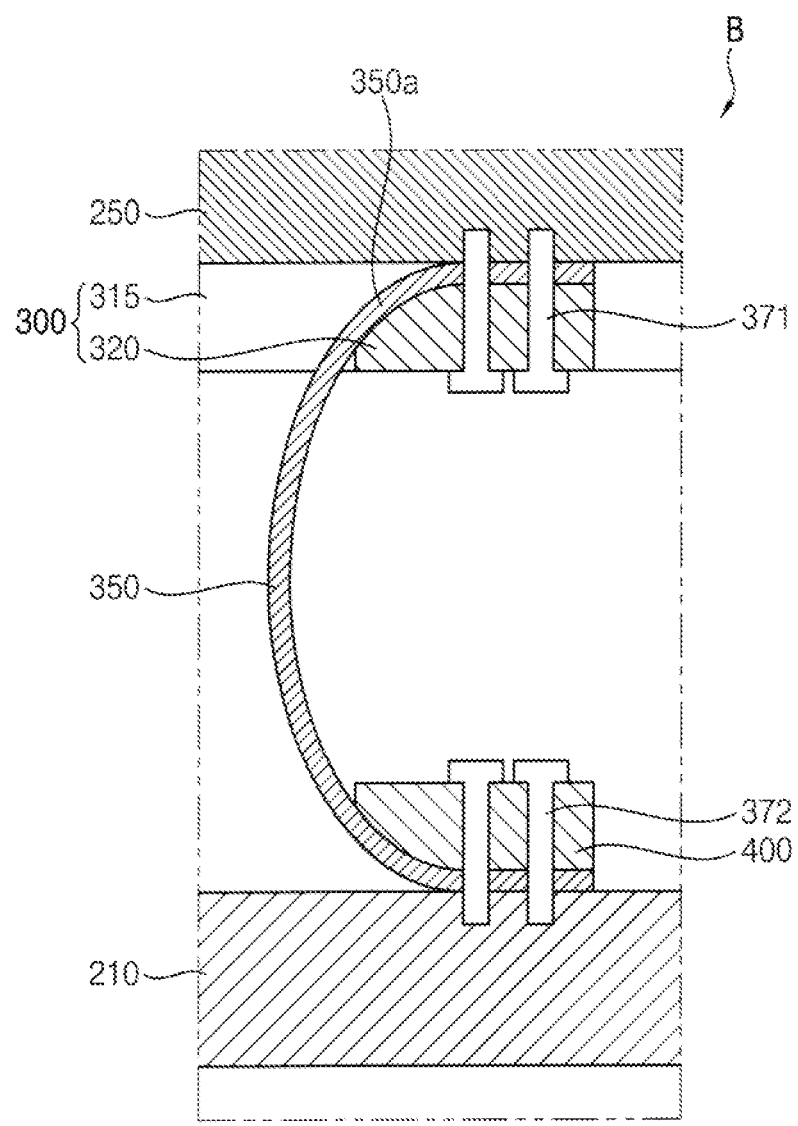
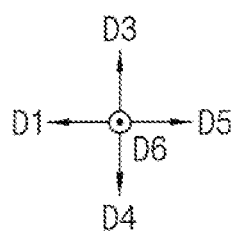

FIG. 11
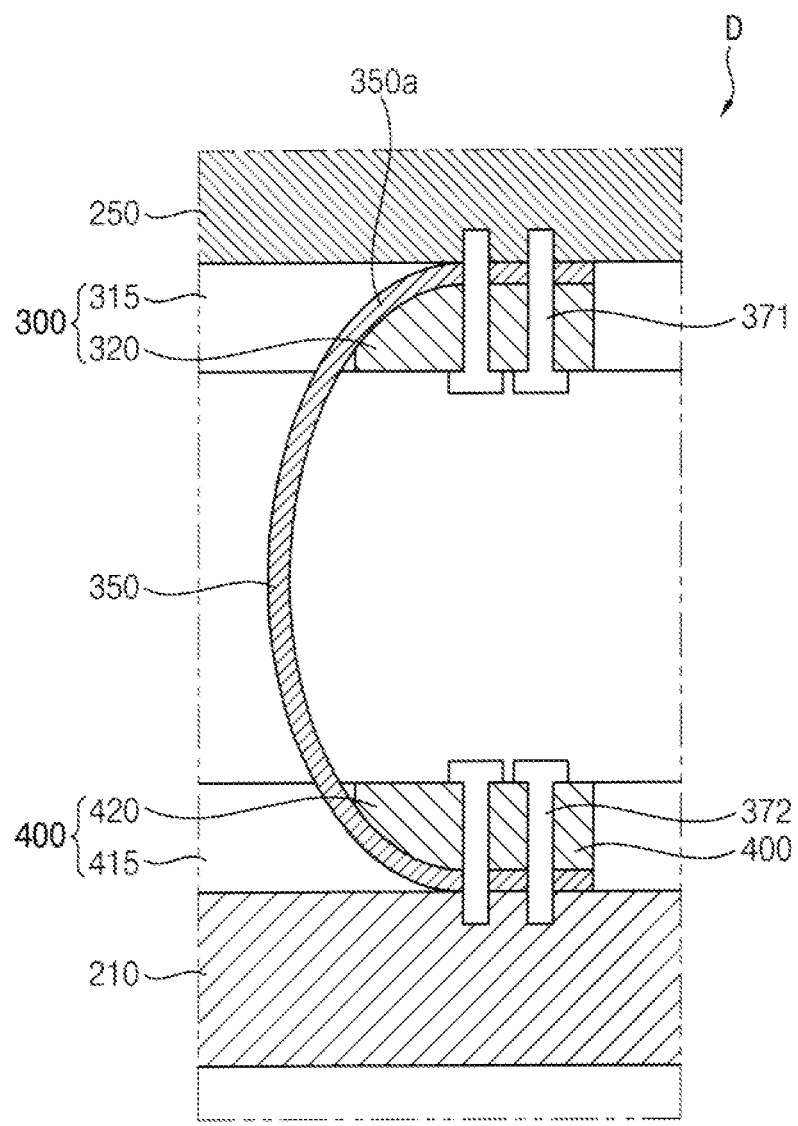
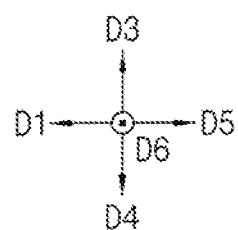

DEPOSITION DEVICE APPARATUS

CROSS-REFERENCE TO RELATED APPLICATION

This application claims priority under 35 USC § 119 to Korean Patent Application No. 10-2020-0113383 filed on Sep. 4, 2020 in the Korean Intellectual Property Office (KIPO), the entire disclosure of which is incorporated herein by reference.

BACKGROUND

1. Field

The present invention relates to a deposition device (i.e., a deposition apparatus), more particularly to, a deposition device including a ground member.

2. Description of the Related Art

Flat panel display devices are used as display devices for replacing a cathode ray tube display device due to light-weight and thin characteristics thereof. As representative examples of such flat panel display devices, there are a liquid crystal display device and an organic light emitting diode display device.

Among methods of forming components included in such a display device, a silicon-based insulating layer, a silicon-based semiconductor layer, and the like may be formed by using a plasma-enhanced chemical vapor deposition process. For example, after an electric field is formed between a diffuser and a susceptor, a deposition material may pass through a through-opening formed in a distribution member so that the deposition material may be deposited on a substrate. A voltage (e.g., an RF voltage) may be applied to the diffuser to form the electric field, and the susceptor may be grounded with a chamber by using a ground strap.

In such a plasma-enhanced chemical vapor deposition process, after a process of depositing a deposition material on a substrate is performed, a cleaning process of removing by-products (e.g., silicon) remaining in the chamber may be performed. However, during the cleaning process, a gas used in the cleaning process may corrode the ground strap, and the corroded ground strap may be broken or fractured.

SUMMARY

Some embodiments provide a deposition device including a ground member.

According to some embodiments, a deposition apparatus includes a chamber, a support member, a ground member, and a first fixing member. The chamber includes a lower portion and a side wall. The support member is located in a space defined by the lower portion and the side wall of the chamber, and includes a first side surface. The ground member is disposed between the support member and the lower portion of the chamber. The first fixing member includes a first body and a first blocking part. The first body is located under a first end portion of the ground member, and includes a first side surface. The first blocking part is located on the first side surface of the first body and the first side surface of the support member, and extends along the first side surface of the support member. The first blocking part shields the first end portion of the ground member from view.

In embodiments, the deposition apparatus may further include a first fixing pin passing through the first body of the first fixing member and the first end portion of the ground member to fix the first body of the first fixing member and the first end portion of the ground member to a bottom surface of the support member adjacent to the first side surface of the support member.

In embodiments, the first body of the first fixing member may further include an upper surface having a flat top surface portion and a curved surface portion, which are adjacent to a bottom surface of the support member. The first fixing pin passes through the flat top surface portion of the first body of the first fixing member.

In embodiments, the first end portion of the ground member may contact the upper surface of the first body of the first fixing member, and the first blocking part may extend beyond the upper surface of the first body to define a space with a bottom surface of the support member and the curved surface portion of the first body so that the space is shielded from the outside of the support member.

In embodiments, the deposition apparatus may further include a second fixing member including a second body, which includes a first side surface and is located on a second end portion opposite to the first end portion of the ground member, and the second fixing member may be adjacent to the lower portion of the chamber.

In embodiments, the deposition apparatus may further include a second fixing pin passing through the second body of the second fixing member and the second end portion of the ground member to fix the second body of the second fixing member and the second end portion of the ground member to the lower portion of the chamber.

In embodiments, the second body of the second fixing member may further include a lower surface having a flat bottom surface portion and a curved surface portion, which are adjacent to the lower portion of the chamber.

In embodiments, the second fixing member may be located under the first fixing member and has an upside-down shape of the first fixing member.

In embodiments, the ground member may have a curved shape between the support member and the lower portion of the chamber, and may extend along the curved surface portion of the first fixing member and the curved surface portion of the second fixing member.

In embodiments, the deposition apparatus may further include a lifting member passing through the lower portion of the chamber, and the lifting member may contact the bottom surface of the support member.

In embodiments, a shape of the ground member may be configured to change in response to moving of the lifting member in a direction from the lower portion of the chamber to the support member or in a direction from the support member to the lower portion of the chamber.

In embodiments, the second fixing member may further include a second blocking part located on the first side surface of the second body. The second blocking part may extend along the first side surface of the support member to shield the second end portion of the ground member from view.

In embodiments, the second end portion of the ground member may contact the second fixing member, and the second blocking part may be configured to shield a space between the lower portion of the chamber and the curved surface portion of the second body from view.

In embodiments, the support member and the chamber may be electrically connected with each other by the ground member.

In embodiments, the chamber may further include a through-opening formed in the lower portion.

In embodiments, the deposition apparatus may further include a suction member connected to the through-opening formed in the lower portion of the chamber, and the suction member may be configured to suck a material located inside the chamber.

In embodiments, the deposition apparatus may further include a cover member, a storage member, and a distribution member. The cover member may be disposed on the chamber, and may include a through-opening. The storage member may be connected to the through-opening of the cover member. The distribution member may be disposed under the through-opening, and may include a plurality of openings.

In embodiments, the cover member and the distribution member may be electrically connected with each other.

In embodiments, the cover member may be electrically isolated from the chamber.

In embodiments, a deposition material stored in the storage member may pass through the openings of the distribution member so as to be deposited on a substrate located on the support member.

According to the deposition apparatus of the embodiments of the present invention, the first fixing member may include a first blocking part and a first body. As the suction member sucks the cleaning gas through the through-opening formed in the lower portion of the chamber, the cleaning gas located between the distribution member and the support member may pass through a top surface of the support member and move in a direction from the support member to the lower portion of the chamber along a side wall of the support member. In this case, the first blocking part of the first fixing member may shield the one portion of the ground member that has the relatively weakened rigidity, so that the cleaning gas may not contact the one portion of the ground member, and the cleaning gas may pass through an outer peripheral surface of the first blocking part of the first fixing member so as to be sucked into the suction member through the through-opening. Accordingly, the one portion of the ground member may not be corroded by the cleaning gas, and the ground member may not be broken even when the cleaning process is performed. In other words, defects of the deposition apparatus caused by the cleaning process may be prevented.

In addition, since the deposition apparatus according to the embodiments of the present invention includes the first blocking part that is integrally formed on the side surface of the support member, the cleaning gas may be completely shielded from the one portion of the ground member.

Further, the first fixing member may include a first blocking part and a first body, and the second fixing member may include a second blocking part and a second body. Accordingly, each of the first end portion and the second end portion of the ground member may not be corroded by the cleaning gas.

BRIEF DESCRIPTION OF THE DRAWINGS

Embodiments can be understood in more detail from the following description taken in conjunction with the accompanying drawings.

FIG. 4 is a sectional view showing 'A' region of FIG. 1 according to embodiments of the present invention.

FIG. 7 is a sectional view showing 'B' region of FIG. 6 according to embodiments of the present invention.

FIG. 11 is a sectional view showing 'D' region of FIG. 10 according to embodiments of the present invention.

DETAILED DESCRIPTION OF THE EMBODIMENTS

Figure 1:
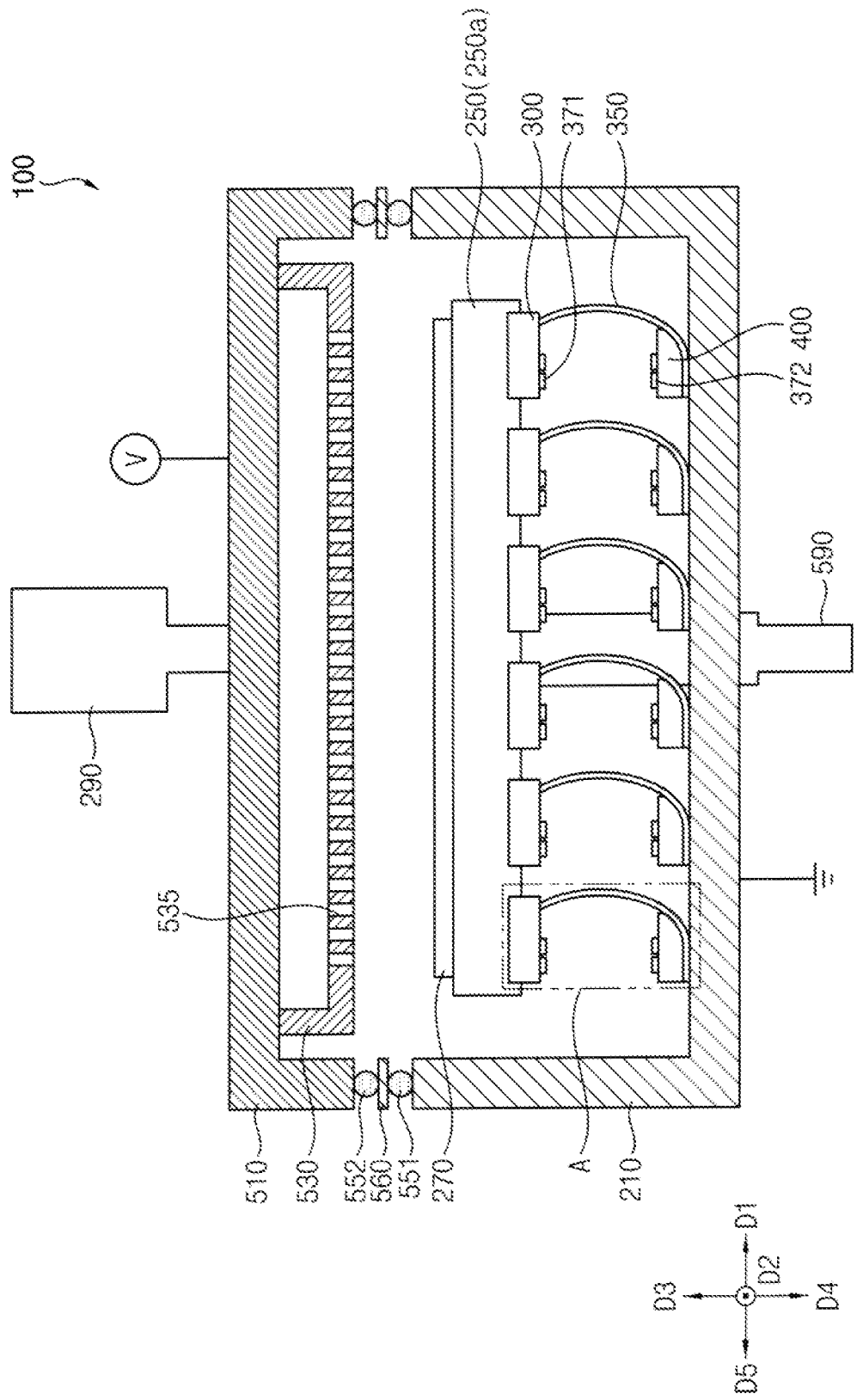
FIG. 1 is a sectional view showing a deposition device according to embodiments of the present invention.

Hereinafter, deposition devices according to embodiments will be described in detail with reference to the accompanying drawings. In the accompanying drawings, same or similar reference numerals refer to the same or similar elements.

Figure 2:
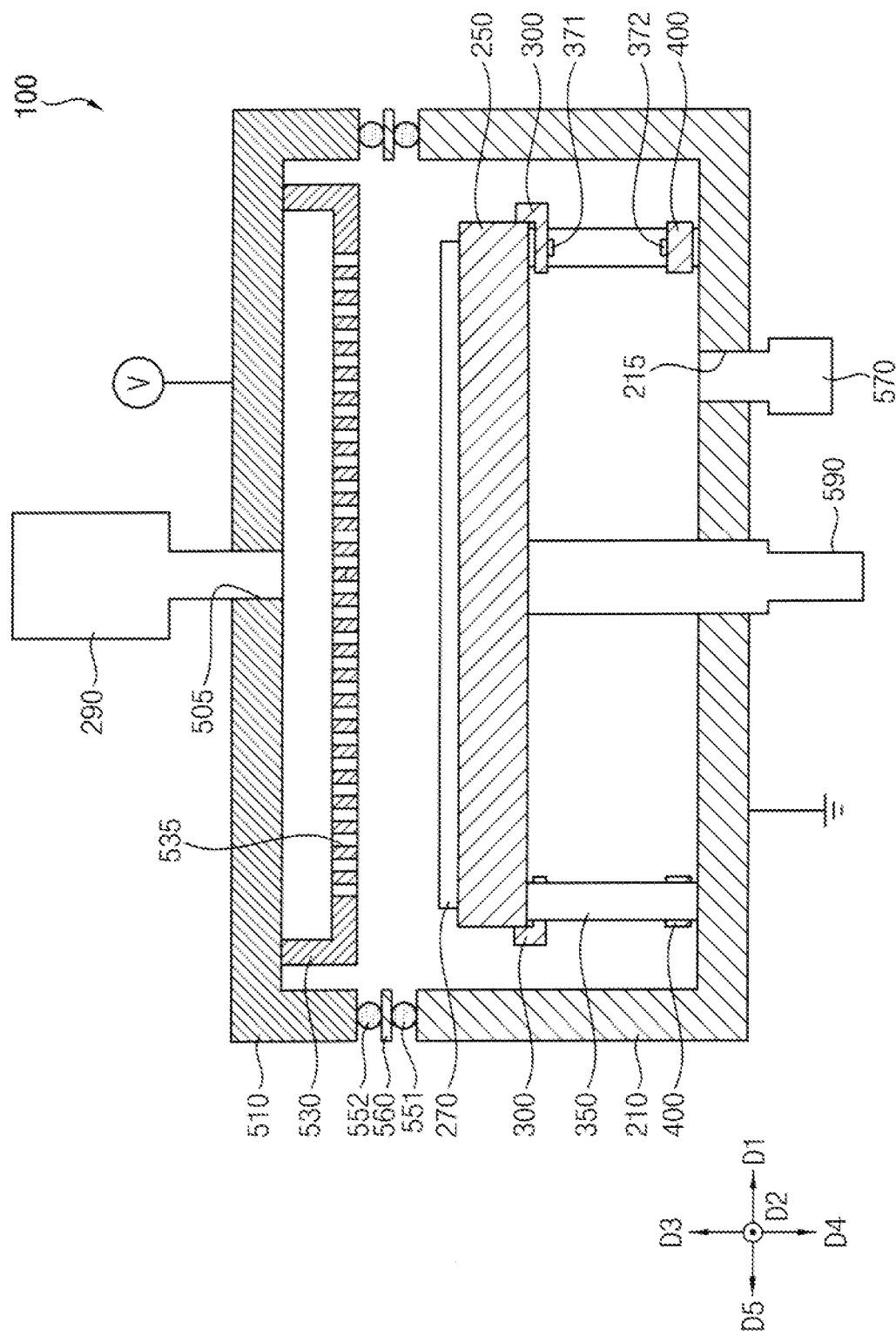
FIG. 2 is a sectional view showing another section of the deposition device of FIG. 1 according to embodiments of the present invention.
Figure 3:
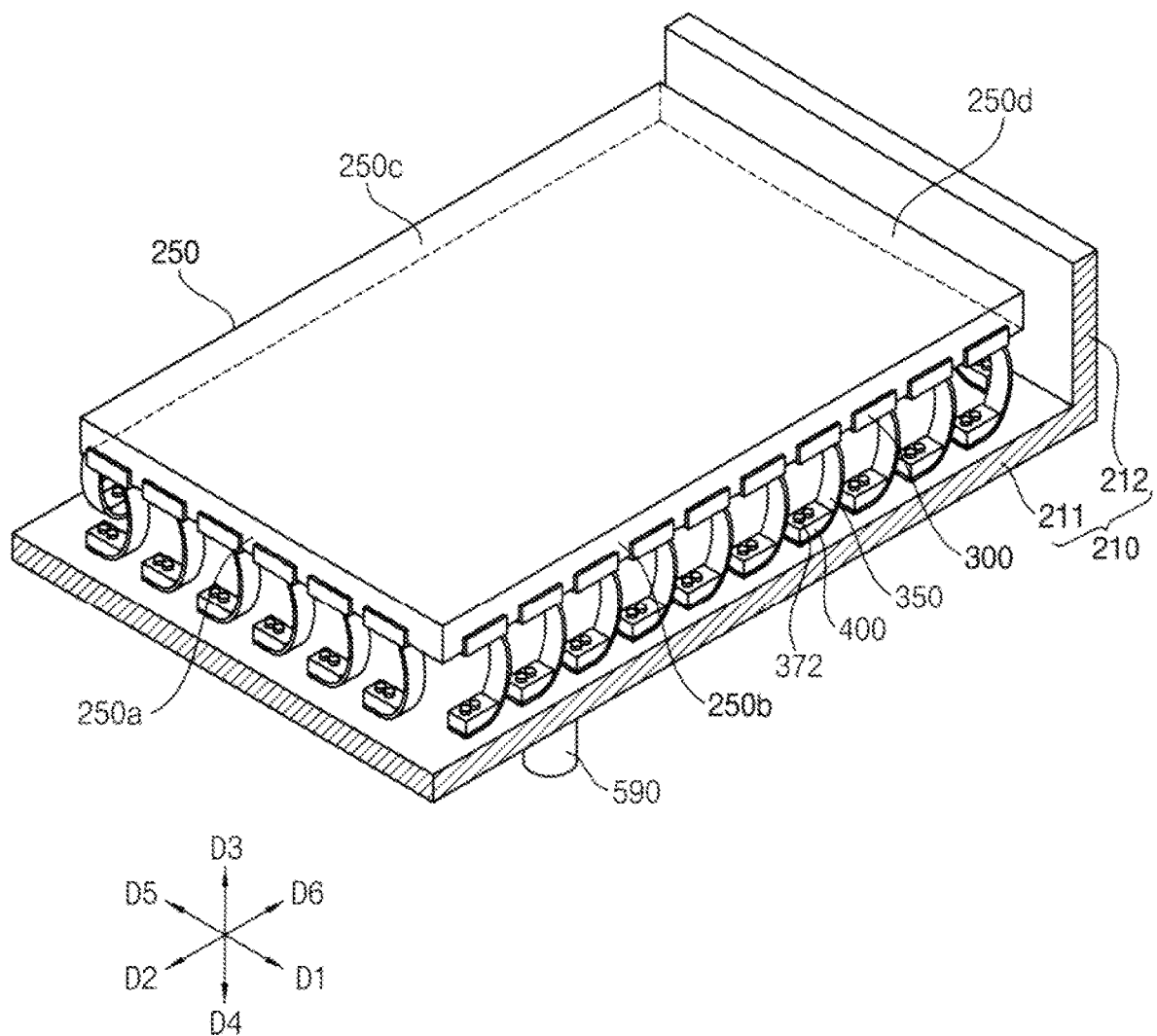
FIG. 3 is a perspective view for describing first and second fixing members and a ground member included in the deposition device of FIG. 1 according to embodiments of the present invention.

FIG. 1 is a sectional view showing a deposition device according to embodiments of the present invention, and FIG. 2 is a sectional view showing another section of the deposition device of FIG. 1. FIG. 3 is a perspective view for describing first and second fixing members and a ground member included in the deposition device of FIG. 1.

Referring to FIGS. 1, 2, and 3, a deposition device 100 may include a chamber 210, a support member 250, a first fixing member 300, a second fixing member 400, a first fixing pin 371, a second fixing pin 372, a ground member 350, a first O-ring 551, a second O-ring 552, an insulating member 560, a suction member 570, a cover member 510, a storage member 290, a distribution member 530, a lifting member 590, and the like. The chamber 210 may include a lower portion 211 and a side wall 212, and may include a through-opening 215 formed in the lower portion 211. The cover member 510 may include a through-opening 505, and the distribution member 530 may include a plurality of openings 535. The support member 250 may include first to fourth side surfaces 250a, 250b, 250c, and 250d, and the first side surface 250a of the support member 250 is shown in FIG. 1.

The deposition device 100 may include a plasma-enhanced chemical vapor deposition (PECVD) device. A silicon-based insulating layer, a silicon-based semiconductor layer, and the like among components included in a display device may be formed by using a PECVD process.

For example, the storage member 290 may store a deposition gas (e.g., a deposition material) including $N_2O$ and $SiH_4$. When a voltage V (e.g., an RF voltage) is applied to the cover member 510, the cover member 510 and the distribution member 530 may electrically communicate with each other, and the voltage V applied to the cover member 510 may be applied to the distribution member 530. The chamber 210 may be in a grounded state. The support member 250 may electrically communicate with the chamber 210 through the first fixing member 300, the second fixing member 400, and the ground member 350, and the support member 250 may also be in a grounded state. To electrically separate the support member 240 which is a grounded state from the cover member 510 which is applied with the voltage V, the insulating member 560 may be interposed between the cover member 510 and the chamber 210, and thus the cover member 510 and the chamber 210 do not contact each other due to the insulating member 560 therebetween. Since the cover member 510 and the chamber 210 are not electrically connected with each other, an electric field may be formed between the distribution member 530 and the support member 250. After the electric field is formed between the distribution member 530 and the support member 250, the deposition gas stored in the storage member 290 may pass through the openings 535 of the distribution member 530, and the deposition gas may be deposited on a substrate 270 disposed on the support member 250 to form a silicon-based insulating layer, a silicon-based semiconductor layer, and the like, on the substrate 270. In some embodiments, an inside of the chamber 210 may be heated during the PECVD process.

However, although the deposition device 100 has been described as including the storage member 290, the configuration of the present invention is not limited thereto. For example, the deposition device 100 does not include the storage member 290, and the deposition device 100 may further include a gas supply line which connects the storage member 290 to the through-opening 505 of the cover member 510. The deposition gas including $N_2O$ and $SiH_4$ may be provided to the deposition device 100 through the gas supply line.

After a process of depositing the deposition material on the substrate 270 is completed, the substrate 270 disposed on the support member 250 may be moved to an outside of the chamber 210. After the substrate 270 is moved to the outside of the chamber 210, a cleaning process may be performed to remove by-products (e.g., silicon) remaining on an inner surface of the chamber 210 after the PECVD process may be performed. The by-products may also be deposited on various parts within the chamber 210 such as the support member 250, the first fixing member 300, the second fixing member 400, the ground member 350, the distribution member 530, and the like. The by-products may fall off to the substrate 270 from the inner surface of the chamber 210 or various parts within the chamber 210 in the PECVD process, and may cause a deposition failure due to the by-products. Therefore, after the PECVD process (or after the PECVD process is performed at least twice, or when there is a special event in a process, etc.), the cleaning process may be performed. For example, the storage member 290 may store a cleaning gas (e.g., a material for removing the deposition material) including $NF_3$ (or CF). The cleaning gas stored in the storage member 290 may pass through the openings 535 of the distribution member 530 and diffuse to the inside of the chamber 210, thereby removing the by-products remaining in the chamber 210, the support member 250, the first fixing member 300, the second fixing member 400, the ground member 350, the distribution member 530, and the like. For example, fluorine (F) of the cleaning gas may react with Si to produce $SiF_4$, which is volatile. The suction member 570 may suck the cleaning gas located inside the chamber 210 through the through-opening 215 and $SiF_4$, for example. In an embodiment, the chamber 210, the first fixing member 300, the second fixing member 400, the ground member 350, and the like may include or may be formed of bare aluminum. Since bare aluminum is very vulnerable to the cleaning gas that is a fluorine-based gas, bare aluminum may be corroded or may cause generation of particles. For example, fluorine (F) of the cleaning gas may react with Al to produce $Al_xF_y$.

In some embodiments, while the cleaning process is performed, the voltage V may be applied to the cover member 510 so that the voltage V applied to the cover member 510 may also be applied to the distribution member 530. The chamber 210 may be in a grounded state, and the support member 250 may also be in a grounded state.

When the cleaning process is performed by using a conventional deposition device, the cleaning gas used in the cleaning process may react with the ground member 350 so that the ground member 350 may be corroded. For example, when the support member 250 may be moved by the lifting member 590 in a direction from the chamber 210 to the cover member 510 or a direction from the cover member 510 to the chamber 210, a shape of the ground member 350 may be changed to cause a stress concentration on one portion of the ground member 350 adjacent to a conventional fixing member (e.g., a fixing member including only a first body 320 without a first blocking part 310), so that rigidity of the one portion may be relatively weakened. When the one portion having the relatively weakened rigidity is corroded by reacting with the cleaning gas used in the cleaning process, the ground member 350 may be broken.

As described above, although the deposition device 100 has been described as having a configuration including the storage member 290, the configuration of the present invention is not limited thereto. For example, the deposition device 100 does not include the storage member 290, and the deposition device 100 may further include a gas supply line which connects the storage member 290 to the through-opening 505. The cleaning gas including $NF_3$ (or CF) may be provided to the deposition device 100 through the gas supply line.

According to the deposition device 100 of the embodiments of the present invention, the first fixing member 300 may include a first blocking part 310 and a first body 320 (see, FIG. 4). As the suction member 570 sucks the cleaning gas through the through-opening 215 formed in the lower portion 211 of the chamber 210, the cleaning gas located between the distribution member 530 and the support member 250 may pass through a top surface of the support member 250 and move in a direction from the support member 250 to the lower portion 211 of the chamber 210 along a side wall (e.g., a first side wall) of the support member 250. The first blocking part 310 of the first fixing member 300 may shield the one portion of the ground member 350 that has the relatively weakened rigidity, so that the cleaning gas does not contact (i.e., does not corrode) the one portion of the ground member 350, and the cleaning gas may pass through an outer peripheral surface of the first blocking part 310 of the first fixing member 300 as to be sucked into the suction member 570 through the through-opening 215. Accordingly, the first blocking part 310 may prevent the one portion of the ground member 350 from being corroded by the cleaning gas in the cleaning process, and the ground member 350, when a stress is concentrated, is not broken. The cleaning process may be performed on the deposition device 100 without causing the corrosion problem.

Referring again to FIGS. 1 to 3, the chamber 210 may include a space defined by the lower portion 211 and the side wall 212. The support member 250, the first fixing member 300, the second fixing member 400, the ground member 350, the substrate 270, and the like may be located in the space. The chamber 210 may be in a grounded state. The chamber 210 may include metal, an alloy, and the like. For example, the chamber 210 may include gold (Au), silver (Ag), aluminum (Al), tungsten (W), copper (Cu), platinum (Pt), nickel (Ni), titanium (Ti), palladium (Pd), magnesium (Mg), calcium (Ca), lithium (Li), chromium (Cr), tantalum (Ta), molybdenum (Mo), scandium (Sc), neodymium (Nd), iridium (Ir), nickel-titanium (Ni—Ti), nickel-aluminum (Ni—Al), copper-zinc-nickel (Cu—Zn—Ni), copper-aluminum-nickel (Cu—Al—Ni), copper-aluminum-manganese (Cu—Al—Mn), titanium-nickel-copper-molybdenum (Ti—Ni—Cu—Mo), cobalt-nickel-gallium:iron (Co—Ni—Ga:Fe), silver-nickel (Ag—Ni), gold-cadmium (Au—Cd), iron-platinum (Fe—Pt), iron-nickel (Fe—Ni), indium-cadmium (In—Cd), and the like. In some embodiments, the chamber 210 may include steel-use stainless (SUS). In some embodiments, the chamber 210 may include or may be formed of aluminum (e.g., bare aluminum).

In other embodiments, the deposition device 100 may further include a chamber cover disposed on the chamber 210 to surround the cover member 510. The chamber cover is not electrically connected to the cover member 510, but may be electrically connected to the chamber 210 to be grounded. The chamber cover may protect the cover member 510. The chamber cover may include a material that is the same as the material included in the chamber 210.

The substrate 270 may include a quartz substrate, a synthetic quartz substrate, a calcium fluoride substrate, a fluorine-doped quartz (F-doped quartz) substrate, a soda lime glass substrate, a non-alkali glass substrate, and the like. In other embodiments, the substrate 270 may be a transparent resin substrate. Examples of the transparent resin substrate that may be used as the substrate 270 include a polyimide substrate. In an embodiment, the polyimide substrate may include a first polyimide layer, a barrier film layer, a second polyimide layer, and the like, and a rigid glass substrate for supporting the polyimide substrate may be located under the polyimide substrate.

The support member 250 may be located in the space of the chamber 210. As shown in FIG. 3, a part of each of first blocking parts 310 of the first fixing member 300 may overlap the first to fourth side surfaces 250a, 250b, 250c, and 250d. For example, the first blocking parts 310 may be arranged in a first direction D1 (or a fifth direction D5 opposite the first direction D1) on each of the first side surface 250a and the fourth side surface 250d, and the first blocking parts 310 may be arranged in a second direction D2 (or a sixth direction D6 opposite to the second direction D2) that is orthogonal to the first direction D1 on each of the second side surface 250b and the third side surface 250c. The first side surface 250a and the fourth side surface 250d may face each other, and the second side surface 250b and the third side surface 250c may face each other. The support member 250 may have a plate shape to support the substrate 270. The support member 250 may be in a grounded state. For example, the support member 250 may electrically communicate with the chamber 210 through the first fixing member 300, the ground member 350, and the second fixing member 400. The support member 250 may include metal, an alloy, and the like. In some embodiments, the support member 250 may include SUS. In some embodiments, the support member 250 may include or may be formed of Al (e.g., anodizing Al). However, a portion of the support member 250 that contacts the ground member 350 may include or may be formed of bare Al without being anodized.

The cover member 510 may be disposed on the chamber 210. The cover member 510 may include a through-opening 505. The storage member 290 may be connected through the through-opening 505. During a deposition process, the voltage V may be applied to the cover member 510. The cover member 510 may include metal, an alloy, and the like. In some embodiments, the cover member 510 may include SUS. In some embodiments, the cover member 510 may include or may be formed of Al (e.g., bare Al).

The storage member 290 may be disposed on the cover member 510 so that the storage member 290 may be connected to the cover member 510 through the through-opening 505. A gas may be stored in the storage member 290. For example, when the deposition device 100 performs the PECVD process, the storage member 290 may be filled with the deposition gas including $N_2O$ and $SiH_4$, and when the deposition device 100 performs the cleaning process, the storage member 290 may be filled with the cleaning gas including $NF_3$. The deposition gas and the cleaning gas may move into the distribution member 530 through the through-opening 505 of the cover member 510. The storage member 290 may include metal, an alloy, and the like. In some embodiments, the storage member 290 may include SUS.

The distribution member 530 may be disposed under the through-opening 505 of the cover member 510. The distribution member 530 may be spaced apart from the support member 250 in a third direction D3 perpendicular to the first and second directions D1 and D2. The distribution member 530 may include a plurality of openings 535. After the deposition gas or the cleaning gas stored in the storage member 290 moves into the distribution member 530 through the through-opening 505 of the cover member 510, the deposition gas or the cleaning gas may move to a space between the distribution member 530 and the substrate 270 through the openings 535 of the distribution member 530. Since a top surface of the distribution member 530 may contact a bottom surface of the cover member 510, the distribution member 530 and the cover member 510 may electrically communicate with each other so that the voltage V applied to the cover member 510 may be applied to the distribution member 530. The distribution member 530 may include metal, an alloy, and the like. In some embodiments, the distribution member 530 may include SUS. In some embodiments, the distribution member 530 may include or may be formed of Al (e.g., bare Al).

The first O-ring 551, the insulating member 560, and the second O-ring 552 may be disposed between the side wall 212 of the chamber 210 and the cover member 510. Each of the first O-ring 551 and the second O-ring 552 may seal a gap between the cover member 510 and the chamber 210, and may prevent the gas located in the space of the chamber 210 from leaking to the outside. For example, the first O-ring 551 may be located between the side wall 212 and the insulating member 560, and the second O-ring 552 may be located between the cover member 510 and the insulating member 560. The insulating member 560 may be located between the first O-ring 551 and the second O-ring 552. The insulating member 560 may prevent the cover member 510 from contacting the chamber 210. Since the chamber 210 is in a grounded state, and the voltage V is applied to the cover member 510, the insulating member 560 may be disposed between the chamber 210 and the cover member 510 so that the chamber 210 and the cover member 510 are electrically connected with each other. For example, to seal a gap between the chamber 210 and the cover member 510, a top surface of the cover member 510 may be pressed in a fourth direction D4 opposite to the third direction D3. Since the insulating member 560 is interposed between the side wall 212 of the chamber 210 and the cover member 510, the side wall 212 of the chamber 210 and the cover member 510 do not contact with each other even when the top surface of the cover member 510 is pressed in the fourth direction D4. Each of the first O-ring 551, the insulating member 560, and the second O-ring 552 may include an insulating material. In some embodiments, each of the first O-ring 551, the insulating member 560, and the second O-ring 552 may be formed of Teflon.

The suction member 570 may be disposed under the lower portion 211 of the chamber 210 so that the suction member 570 may be connected to the through-opening 215 formed in the lower portion 211 of the chamber 210. The suction member 570 may suck air located in the space of the chamber 210 to maintain the space in a vacuum state in the PECVD process. In the cleaning process, the suction member 570 may suck the cleaning gas located in the space of the chamber 210. Since the suction member 570 is connected to the through-opening 215 formed in the lower portion 211, the cleaning gas located in the space may move in the fourth direction D4 to be sucked into the suction member 570. The suction member 570 may include metal, an alloy, and the like. In some embodiments, the suction member 570 may include SUS.

The lifting member 590 may pass through the lower portion 211 of the chamber 210 and may contact a bottom surface of the support member 250. The lifting member 590 may move in the third direction D3 or the fourth direction D4. For example, as shown in FIGS. 1, 2, and 3, when the lifting member 590 moves in the third direction D3 (e.g., a direction from the lower portion 211 of the chamber 210 to the support member 250), a distance between the substrate 270 and the distribution member 530 may be relatively reduced, and the ground member 350 may have a smooth curved shape. Alternatively, when the lifting member 590 moves in the fourth direction D4 (e.g., a direction from the support member 250 to the lower portion 211 of the chamber 210), the distance between the substrate 270 and the distribution member 530 may be relatively increased, and the ground member 350 may have a steep curved shape or an S-shape. Moving of the lifting member 590 in the third direction D3 or the fourth direction D4 may change the shape of the ground member 350. In some embodiments, the lifting member 590 may be in a grounded state, and the support member 250 may electrically communicate with the lifting member 590. A portion of the support member 250 that contacts the lifting member 590 may include or may be formed of bare Al without being anodized. The lifting member 590 may include metal, an alloy, and the like. In some embodiments, the lifting member 590 may include SUS. In some embodiments, the lifting member 590 may include or may be formed of Al (e.g., bare Al).

Figure 5A:
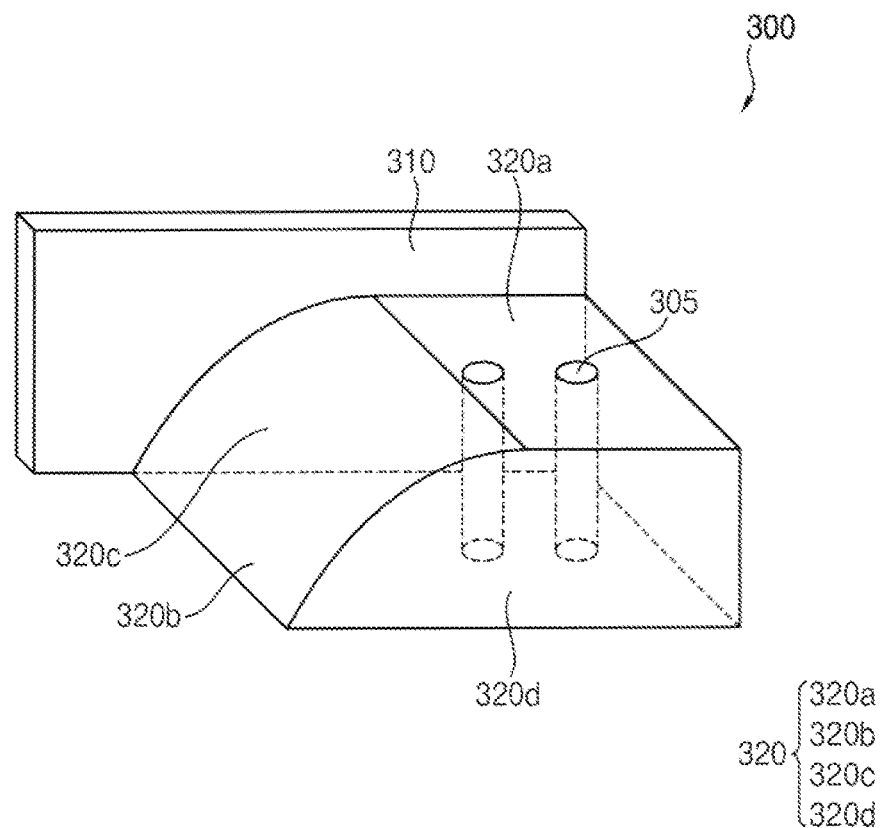
FIGS. 5A and 5B are perspective views for describing the first and second fixing members shown in FIG. 4 according to embodiments of the present invention.
Figure 5B:
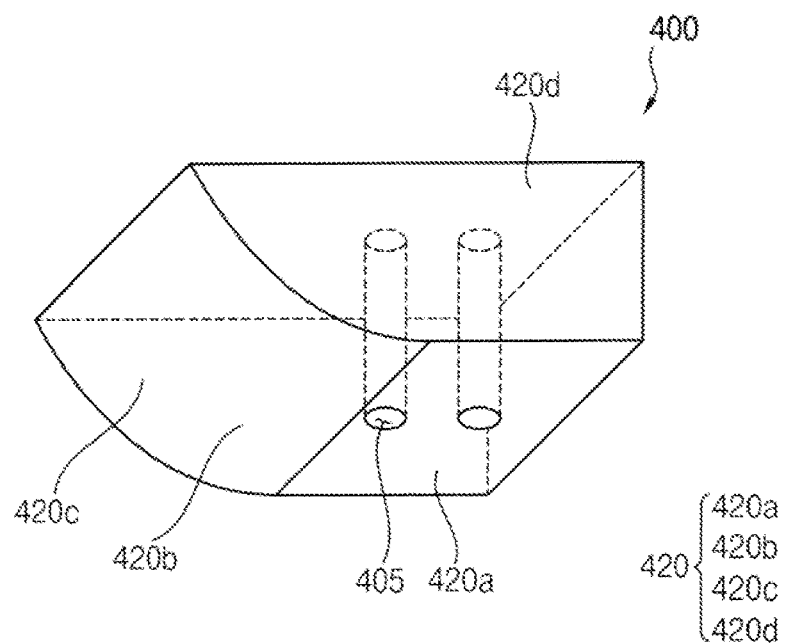

FIG. 4 is a sectional view showing 'A' region of FIG. 1. FIGS. 5A and 5B are perspective views for describing the first and second fixing members shown in FIG. 4. For example, FIG. 4 is a sectional view for describing one first fixing member 300 disposed on the first side surface 250a, the ground member 350 connected to the first fixing member 300, and the second fixing member 400 connected to the ground member 350 when viewed in a direction from the inside to the outside of the chamber 210 of FIG. 3 (e.g., the second direction D2).

Referring to FIGS. 1, 4, 5A, and 5B, the first fixing member 300 may include a first blocking part 310 and a first body 320, and the second fixing member 400 may include a second body 420. As shown in FIG. 5A, the first body 320 may include a first side surface 320c, a second side surface 320d facing the first side surface 320c, and an upper surface having a top surface portion 320a and a curved surface portion 320b. In an embodiment, the top surface portion 320a may be a flat top surface. As shown in FIG. 5B, the second body 420 may include a first side surface 420c, a second side surface 420d facing the first side surface 420c, and a lower surface having a bottom surface portion 420a and a curved surface portion 420b. In an embodiment, the bottom surface portion 420a may be a flat bottom surface.

The ground member 350 may be disposed between the support member 250 and the lower portion 211 of the chamber 210. For example, a first end portion of the ground member 350 may be located between the bottom surface of the support member 250 and the top surface portion 320a and between the bottom surface of the support member 250 and the curved surface portion 320b of the first body 320, and a second end portion opposite to the first end portion of the ground member 350 may be located between the lower portion 211 of the chamber 210 and the bottom surface portion 420a and between the lower portion 211 of the chamber 210 and the curved surface portion 420b of the second body 420. In an embodiment, the first end portion may contact the top surface portion 320a, and the second end portion may contact the bottom surface portion 420a. Since the first and second end portions of the ground member 350 contact with the support member 250 and the chamber 210, respectively, the support member 250 may be grounded. Accordingly, the support member 250 and the chamber 210 may electrically communicate with each other by the ground member 350.

In some embodiments, when the lifting member 590 moves in the fourth direction D4, the ground member 350 may be pressed inwardly, and a contact area between the first end portion of the ground member 350 of FIG. 4 and the top surface portion 320a may become relatively small.

As described above, as the lifting member 590 moves in the third direction D3 or the fourth direction D4, a stress may be concentrated on a portion 350a of the ground member 350 which is adjacent to the first fixing member 300. In an embodiment, the portion 350a of the ground member 350 may be positioned on the curved surface portion 320b of the first fixing member 300. The concentrated stress may cause rigidity of the portion 350a to be relatively weakened. For example, the portion 350a of the ground member 350 may be a portion that overlaps the curved surface portion 320b of the first fixing member 300, and the first blocking part 310 may shield the portion 350a from a cleaning gas in a cleaning process. In an embodiment, the portion 350a of the ground member 350 may be part of the first end portion of the ground member 350.

According to the conventional deposition device, the cleaning gas used in the cleaning process may move in the fourth direction D4. Since a first fixing member of the conventional deposition device does not include the first blocking part 310, a space defined by the curved surface portion 320b and the bottom surface of the support member 250 adjacent to the curved surface portion 320b may be exposed to the cleaning gas moving in the fourth direction D4. For example, some of the cleaning gas moving in the fourth direction D4 may permeate into the space, thereby corroding the ground member 350. When the cleaning gas corrodes the portion 350a of the ground member 350 having the relatively weakened rigidity, the moving of the lifting member 590 may cause the portion 350a of the ground member 350 to be broken.

In some embodiments, the first blocking part 310 may be formed on the first side surface 320c of the first body 320, and the first blocking part 310 may shield the space defined by the curved surface portion 320b and the bottom surface of the support member 250 so that the space is not exposed to the outside where the cleansing gas moves in the fourth direction D4, or the space is shielded by the first blocking part 310 from view. Accordingly, the first blocking part 310 may prevent the cleaning gas from permeating into the space, and the cleaning gas does not corrode the portion 350a of the ground member 350.

As shown in FIG. 3, the ground member 350 may have a shape bent in a direction that is the same as a planar direction of a side surface of the support member 250. The ground member 350 does not have a bent shape that protrudes in a direction protruding from the side surface of the support member 250. For example, each of ground members 350 may have an inner surface and an outer surface, in which the inner surface and the outer surface are defined such that the inner surface of each ground member 350 contacts the top surface portion 320a of the first fixing member 300 (or the bottom surface portion 420a of the second fixing member 400), and the outer surface of each ground member 350 contacts the bottom surface of the support member 250 (or the lower portion 211 of 210). The bent shape of each of the ground members 350 adjacent to the first side surface 250a of the support member 250 may be such that the outer surface faces the first direction D1, the bent shape of each of the ground members 350 adjacent to the second side surface 250b of the support member 250 may be such that the outer surface faces the sixth direction D6, the bent shape of each of the ground members 350 adjacent to the third side surface 250c of the support member 250 may be such that the outer surface faces the second direction D2, and the bent shape of each of the ground members 350 adjacent to the fourth side surface 250d of the support member 250 may be such that the outer surface faces the fifth direction D5. The bent shape of each of the ground members 350 may be determined as described above so that the portion 350a may be shielded by the first blocking part 310 of the first fixing member 300. In some embodiments, the bent shape of each of the ground members 350 adjacent to the first side surface 250a may be such that the outer surface faces the fifth direction D5, the bent shape of each of the ground members 350 adjacent to the second side surface 250b may be such that the outer surface faces the second direction D2, the bent shape of each of the ground members 350 adjacent to the third side surface 250c may be such that the outer surface faces the sixth direction D6, and the bent shape of each of the ground members 350 adjacent to the fourth side surface 250d may be such that the outer surface faces the first direction D1.

The ground member 350 may include metal, an alloy, and the like. In some embodiments, the ground member 350 may include SUS. In some embodiments, the ground member 350 may include or may be formed of Al (e.g., bare Al or multi-bonded Al).

The first fixing member 300 may be disposed under the first end portion of the ground member 350, and may overlap at least a part of a side surface (e.g., the first to fourth side surfaces 250a, 250b, 250c, and 250d) of the support member 250. For example, the first body 320 may be located under the first end portion, and the first blocking part 310 located on the first side surface 320c of the first body 320 may contact at least a part of the side surface of the support member 250. The first blocking part 310 may extend in a direction parallel to the side surface of the support member 250, and may overlap the first end portion (e.g., the portion 350a) of the ground member 350. For example, in FIG. 3, each of the portions 350a of the ground members 350 may be shielded by a corresponding first blocking part 310 which may be attached to (or contact) a side surface (e.g., the first to fourth side surfaces 250a, 250b, 250c, and 250d) of the support member 250. As described above, a cleaning gas may flow along the side surface of the support member 250 to be sucked out by the suction member 570, and thus the first blocking parts 310 may prevent the cleaning gas flowing to the suction member 570 along the side surface of the support member 250 from diffusing to the portions 350a of the ground members 350.

The top surface portion 320a of the first body 320 may be adjacent to the bottom surface of the support member 250, and the curved surface portion 320b may be located in a direction in which the first blocking part 310 protrudes from the top surface portion 320a. The curved surface portion 320b may be formed on the first body 320 to reduce the stress of the ground member 350, and a first through-opening 305 may be formed in the first body 320 to fix the ground member 350 to the support member 250 through the first fixing pin 371.

The first fixing member 300 may include metal, an alloy, and the like. In some embodiments, the first fixing member 300 may include SUS. In some embodiments, the first fixing member 300 may include or may be formed of Al (e.g., bare Al). In some embodiments, the first blocking part 310 and the first body 320 may be integrally formed. In other embodiments, the first blocking part 310 may be fixed to the first body 320 through a fixing pin or the like. In some embodiments, the first blocking part 310 may contact the first body 320, and a corresponding side surface of the side surfaces 250a to 250d of the support member 250.

The first fixing pin 371 may pass through the first body 320 of the first fixing member 300 and the first end portion of the ground member 350 to fix the first body 320 of the first fixing member 300 and the first end portion of the ground member 350 to the bottom surface of the support member 250 adjacent to the side surface (e.g., the first to fourth side surfaces 250a, 250b, 250c, and 250d) of the support member 250. For example, the first fixing pin 371 may pass through the first through-opening 305 of the first fixing member 300 and the ground member 350 to be impregnated into the support member 250. A through-opening or a groove that overlaps the first through-opening 305 may be formed at the first end portion of the ground member 350, and the first fixing pin 371 may pass through the through-opening or the groove. The first fixing pin 371 may include metal, an alloy, and the like. In some embodiments, the first fixing pin 371 may include SUS.

In some embodiments, the first fixing pin 371 may pass through a portion of the top surface of the support member 250 that overlaps the first through-opening 305 to extend to the first body 320. The first fixing pin 371 may pass through the support member 250 to be impregnated into the first body 320 of the first fixing member 300. When the first fixing pin 371 is impregnated into the support member 250 and the first body 320, a screw thread may be formed in the support member 250 and the first body 320.

The second fixing member 400 may be disposed on the second end portion opposite to the first end portion of the ground member 350. For example, the second body 420 may be located on the second end portion. In an embodiment, the bottom surface portion 420a of the second body 420 may be adjacent to the lower portion 211 of the chamber 210, and the curved surface portion 420b may be located in the direction in which the first blocking part 310 protrudes. The curved surface portion 420b may be formed on the second body 420 to reduce the stress of the ground member 350, and a second through-opening 405 may be formed in the second body 420 to fix the ground member 350 to the lower portion 211 of the chamber 210 through the second fixing pin 372. In some embodiments, the second fixing member 400 may be located under the first fixing member 300, and the first body 320 of the first fixing member 300 and the second body 420 of the second fixing member 400 may be symmetrically arranged in a direction parallel to the top surface of the support member 250. For example, the second fixing member 400 may have an upside-down shape of the first fixing member 300. In an embodiment, the ground member 350 may have a curved shape (e.g., a bent shape) between the support member 250 and the lower portion 211 of the chamber 210 due to the curved surface portion 320b of the first fixing member 300 and the curved surface portion 420b of the second fixing member 400. The second fixing member 400 may include metal, an alloy, and the like. In some embodiments, the second fixing member 400 may include SUS. In some embodiments, the second fixing member 400 may include or may be formed of Al (e.g., bare Al).

The second fixing pin 372 may pass through the second body 420 of the second fixing member 400 and the second end portion of the ground member 350 to fix the second body 420 of the second fixing member 400 and the second end portion of the ground member 350 to the lower portion 211 of the chamber 210. For example, the second fixing pin 372 may pass through the second through-opening 405 of the second fixing member 400 and the ground member 350 to be impregnated into the lower portion 211 of the chamber 210. A through-opening or a groove that overlaps the second through-opening 405 may be formed at the second end portion of the ground member 350, and the second fixing pin 372 may pass through the through-opening or the groove. The second fixing pin 372 may include metal, an alloy, and the like. In some embodiments, the second fixing pin 372 may include SUS.

However, although the first end portion of the ground member 350 according to the present invention has been shown as contacting the support member 250 (or although the second end portion of the ground member 350 according to the present invention has been shown as making direct contact with the lower portion 211 of the chamber 210), the configuration of the present invention is not limited thereto. For example, a strap bar including bare Al may be interposed between the first end portion of the ground member 350 and the support member 250 (or between the second end portion of the ground member 350 and the lower portion 211 of the chamber 210).

Accordingly, the deposition device 100 shown in FIGS. 1 to 5B may be provided.

Figure 6:
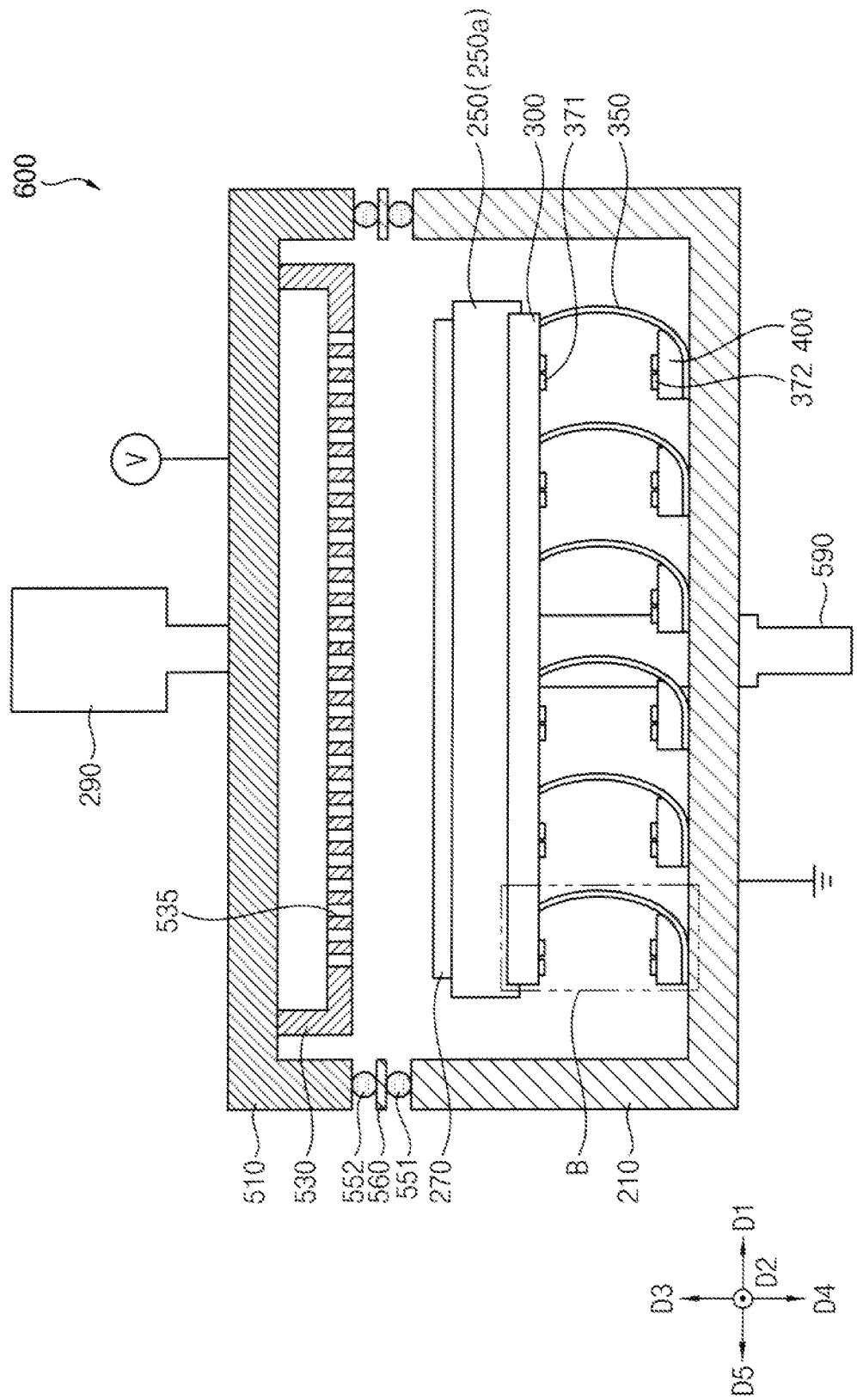
FIG. 6 is a sectional view showing a deposition device according to embodiments of the present invention.

FIG. 6 is a sectional view showing a deposition device according to embodiments of the present invention, and FIG. 7 is a sectional view showing 'B' region of FIG. 6. A deposition device 600 illustrated in FIGS. 6 and 7 may have a configuration that is substantially identical or similar to the configuration of the deposition device 100 described with reference to FIGS. 1 to 5B except for the first fixing member 300 including the first blocking part 315 and the first body 320. In FIGS. 6 and 7, redundant descriptions of components that are substantially identical or similar to the components described with reference to FIGS. 1 to 5B will be omitted.

Referring to FIGS. 6 and 7, the deposition device 600 may include a chamber 210, a support member 250, a first fixing member 300, a second fixing member 400, a first fixing pin 371, a second fixing pin 372, a ground member 350, a first O-ring 551, a second O-ring 552, an insulating member 560, a suction member 570, a cover member 510, a storage member 290, a distribution member 530, a lifting member 590, and the like. In an embodiment, the chamber 210 may include a lower portion 211 and a side wall 212, the support member 250 may include first to fourth side surfaces 250a, 250b, 250c, and 250d, and the support member 250 shown in FIG. 6 corresponds to the first side surface 250a. The first fixing member 300 may include a first blocking part 315 and a first body 320, and the second fixing member 400 may include a second body 420. As shown in FIG. 5A, the first body 320 may include a first side surface 320c, a second side surface 320d facing the first side surface 320c, and an upper surface having a top surface portion 320a and a curved surface portion 320b. In an embodiment, the top surface portion 320a may be a flat top surface. As shown in FIG. 5B, the second body 420 may include a first side surface 420c, a second side surface 420d facing the first side surface 420c, and a lower surface having a bottom surface portion 420a and a curved surface portion 420b. In an embodiment, the bottom surface portion 420a may be a flat bottom surface.

When compared with the first blocking part 310 of FIGS. 1 to 5B, the first blocking part 315 of FIGS. 6 and 7 may include one first blocking part 315 that overlaps at least a part of the first side surface 250a, one first blocking part 315 that overlaps at least a part of the second side surface 250b, one first blocking part 315 that overlaps at least a part of the third side surface 250c, and one first blocking part 315 that overlaps at least a part of the fourth side surface 250d. For example, the deposition device 100 may include a plurality of first blocking parts 310 on the side surface of the support member 250, and the deposition device 600 may include a first blocking part 315 (i.e., a single blocking part) that is integrally formed on the side surface of the support member 250. The single blocking part may extend along a side surface of the support member 250 to shield the portions 350a of the ground members 350 adjacent to the side surface of the support member 250 from view.

Since the deposition device 600 according to the embodiments of the present invention includes the first blocking part 315 that is integrally formed on the side surface of the support member 250, the cleaning gas may be completely shielded from the portion 350a of the ground member 350, and the ground member 350 may be used without being broken (e.g., fracture) due to corrosion even when the cleaning process is performed.

Figure 8:
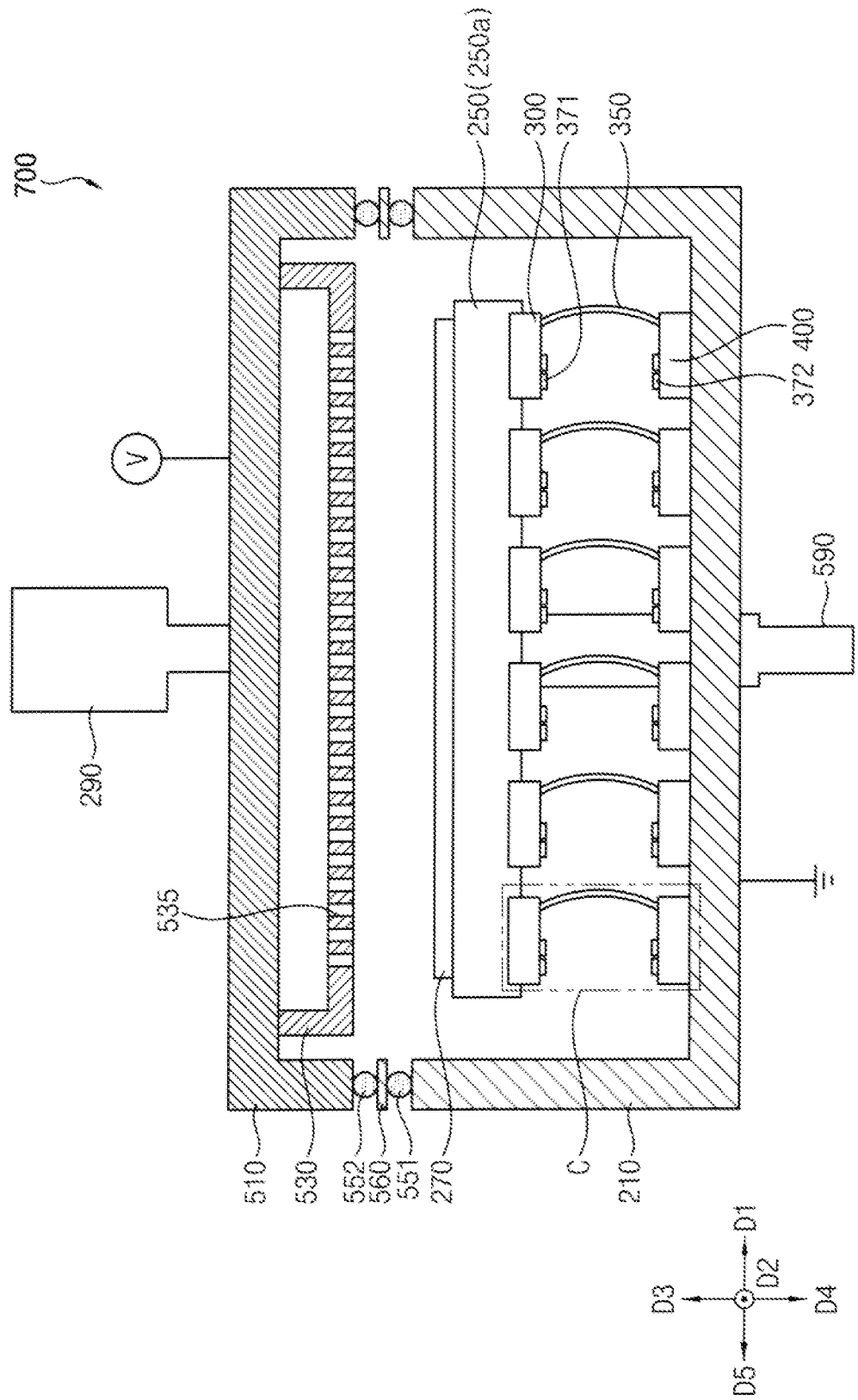
FIG. 8 is a sectional view showing a deposition device according to embodiments of the present invention according to embodiments of the present invention.
Figure 9:
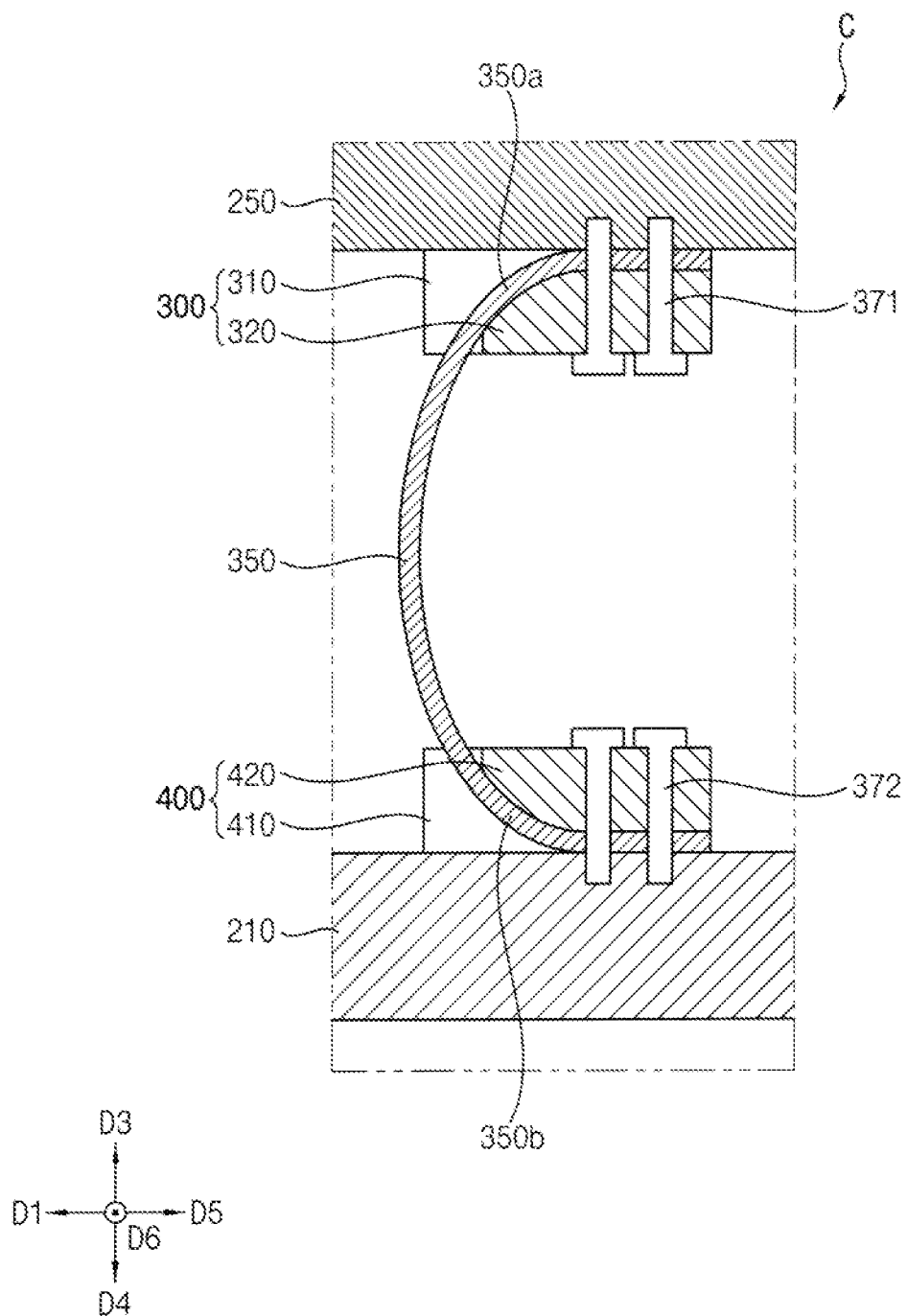
FIG. 9 is a sectional view showing 'C' region of FIG. 8 according to embodiments of the present invention.

FIG. 8 is a sectional view showing a deposition device according to embodiments of the present invention, and FIG. 9 is a sectional view showing 'C' region of FIG. 8. A deposition device 700 illustrated in FIGS. 8 and 9 may have a configuration that is substantially identical or similar to the configuration of the deposition device 100 described with reference to FIGS. 1 to 5B except for a second fixing member 400 including a second blocking part 410 and a second body 420. In FIGS. 8 and 9, redundant descriptions of components that are substantially identical or similar to the components described with reference to FIGS. 1 to 5B will be omitted.

Referring to FIGS. 8 and 9, the deposition device 700 may include a chamber 210, a support member 250, a first fixing member 300, a second fixing member 400, a first fixing pin 371, a second fixing pin 372, a ground member 350, a first O-ring 551, a second O-ring 552, an insulating member 560, a suction member 570, a cover member 510, a storage member 290, a distribution member 530, a lifting member 590, and the like. The chamber 210 may include a lower portion 211 and a side wall 212, the support member 250 may include first to fourth side surfaces 250a, 250b, 250c, and 250d, and the support member 250 shown in FIG. 8 corresponds to the first side surface 250a. The first fixing member 300 may include a first blocking part 310 and a first body 320, and the second fixing member 400 may include a second blocking part 410 and a second body 420. As shown in FIG. 5A, the first body 320 may include a first side surface 320c, a second side surface 320d facing the first side surface 320c, and an upper surface having a top surface portion 320a and a curved surface portion 320b. In an embodiment, the top surface portion 320a may be a flat top surface. As shown in FIG. 5B, the second body 420 may include a first side surface 420c, a second side surface 420d facing the first side surface 420c, and a lower surface having a bottom surface portion 420a and a curved surface portion 420b. In an embodiment, the bottom surface portion 420a may be a flat bottom surface. The ground member 350 may include a first portion 350a, which is part of a first end portion, and a second portion 350b, which is part of a second end portion.

The second fixing member 400 may be disposed on the second portion 350b of the ground member 350. For example, the second body 420 may be located on the second portion 350b, and the second blocking part 410 may be located on the first side surface 420c of the second body 420. In some embodiments, the second blocking part 410 may extend in a direction parallel to the side surface of the support member 250 or a direction parallel to the first blocking part 310, and may overlap the second portion 350b of the ground member 350. For example, the second blocking part 410 may be formed on the first side surface 420c of the second body 420, and the second blocking part 410 may shield a space defined by the lower portion 211 of the chamber 210 and the curved surface portion 420b so that the space is not exposed to the outside. In some embodiments, the second blocking part 410 and the second body 420 may be integrally formed. In other embodiments, the second blocking part 410 may be fixed to the second body 420 through a fixing pin or the like.

For example, the support member 250 may be moved by the lifting member 590 in the third direction D3 or the fourth direction D4. Such moving of the lifting member 590 may change the shape of the ground member 350, and as the shape of the ground member 350 is changed, a stress may be concentrated on the first portion 350a and the second portion 350b of the ground member 350 adjacent to the first and second fixing members 300 and 400, respectively, so that rigidity of each of the first portion 350a and the second portion 350b may be relatively weakened.

According to the deposition device 700 of the embodiments of the present invention, the first fixing member 300 may include a first blocking part 310 and a first body 320, and the second fixing member 400 may include a second blocking part 410 and a second body 420. As the suction member 570 sucks the cleaning gas through the through-opening 215 formed in the lower portion 211 of the chamber 210, the cleaning gas located between the distribution member 530 and the support member 250 may pass through the top surface of the support member 250 and move in the direction from the support member 250 to the lower portion 211 of the chamber 210 along the side wall (e.g., the first side wall) of the support member 250. The first blocking part 310 of the first fixing member 300 and the second blocking part 410 of the second fixing member 400 may shield the first portion 350a and the second portion 350b of the ground member 350 that have the relatively weakened rigidity, respectively, so that the cleaning gas does not contact each of the first portion 350a and the second portion 350b of the ground member 350, and the cleaning gas may pass through an outer peripheral surface of the first blocking part 310 of the first fixing member 300 and an outer peripheral surface of the second blocking part 410 of the second fixing member 400 to be sucked into the suction member 570 through the through-opening 215. Accordingly, each of the first portion 350a and the second portion 350b of the ground member 350 may avoid corrosion by the cleaning gas, and the ground member 350 may be used without being broken (e.g., fracture) even when the cleaning process is performed. In other words, defects of the deposition device 700 caused by the cleaning process may be prevented.

Figure 10:
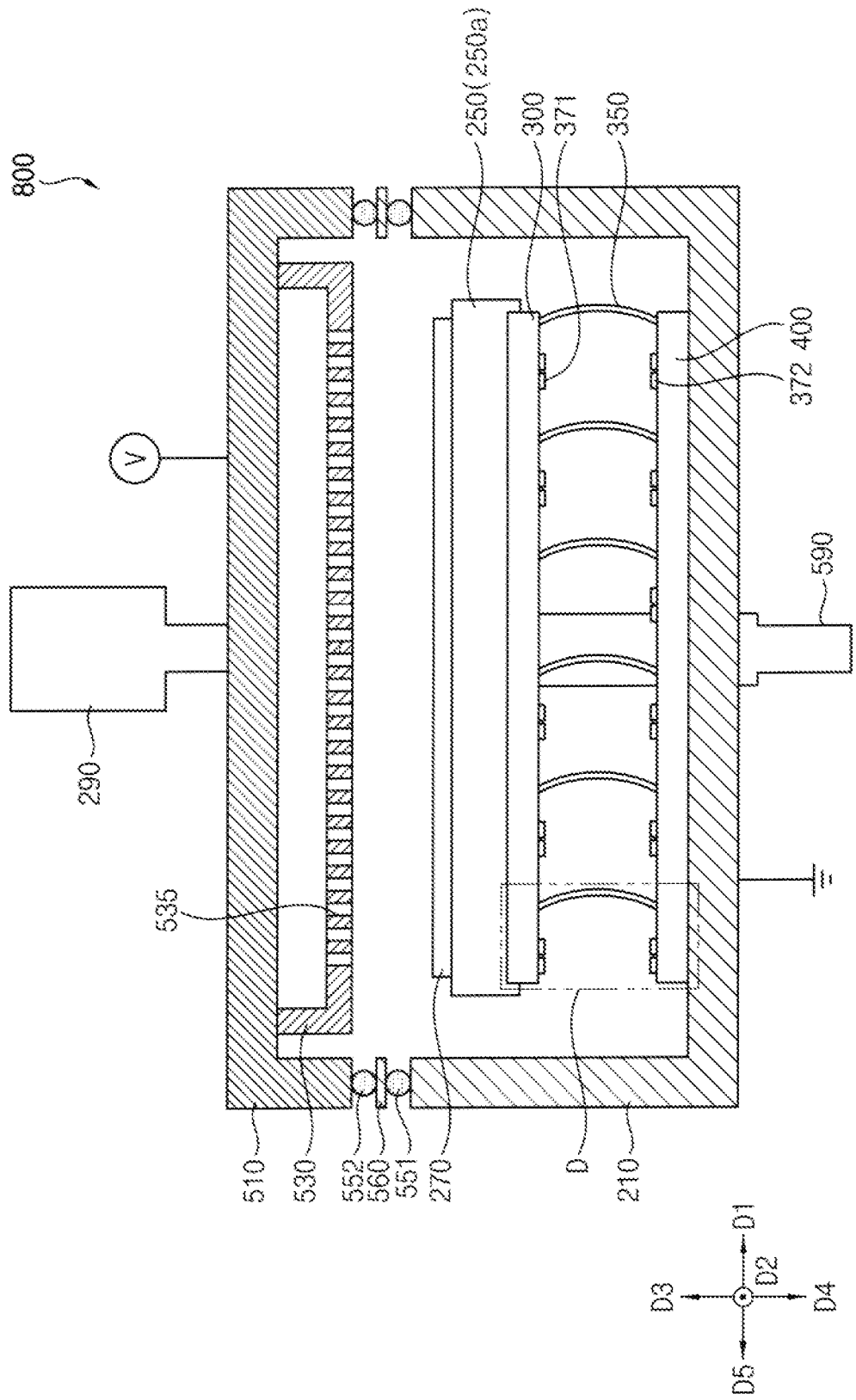
FIG. 10 is a sectional view showing a deposition device according to embodiments of the present invention.

FIG. 10 is a sectional view showing a deposition device according to embodiments of the present invention, and FIG. 11 is a sectional view showing 'D' region of FIG. 10. A deposition device 800 illustrated in FIGS. 10 and 11 may have a configuration that is substantially identical or similar to the configuration of the deposition device 700 described with reference to FIGS. 8 and 9 except for a first fixing member 300 including a first blocking part 315 and a first body 320, and a second fixing member 400 including a second blocking part 415 and a second body 420. In FIGS. 10 and 11, redundant descriptions of components that are substantially identical or similar to the components described with reference to FIGS. 8 and 9 will be omitted.

Referring to FIGS. 10 and 11, the deposition device 800 may include a chamber 210, a support member 250, a first fixing member 300, a second fixing member 400, a first fixing pin 371, a second fixing pin 372, a ground member 350, a first O-ring 551, a second O-ring 552, an insulating member 560, a suction member 570, a cover member 510, a storage member 290, a distribution member 530, a lifting member 590, and the like. In an embodiment, the chamber 210 may include a lower portion 211 and a side wall 212, the support member 250 may include first to fourth side surfaces 250a, 250b, 250c, and 250d, and the support member 250 shown in FIG. 10 corresponds to the first side surface 250a. The first fixing member 300 may include a first blocking part 315 and a first body 320, and the second fixing member 400 may include a second blocking part 415 and a second body 420. As shown in FIG. 5A, the first body 320 may include a first side surface 320c, a second side surface 320d facing the first side surface 320c, and an upper surface having a top surface portion 320a and a curved surface portion 320b. In an embodiment, the top surface portion 320a may be a flat top surface. As shown in FIG. 5B, the second body 420 may include a first side surface 420c, a second side surface 420d facing the first side surface 420c, and a lower surface having a bottom surface portion 420a and a curved surface portion 420b. In an embodiment, the bottom surface portion 420a may be a flat bottom surface.

When compared with the second blocking part 410 of FIGS. 8 and 9, the second blocking part 415 of FIGS. 10 and 11 may include one second blocking part 415 disposed under the one first blocking part 315 that overlaps at least a part of the first side surface 250a, one second blocking part 415 disposed under the one first blocking part 315 that overlaps at least a part of the second side surface 250b, one second blocking part 415 disposed under the one first blocking part 315 that overlaps at least a part of the third side surface 250c, and one second blocking part 415 disposed under the one first blocking part 315 that overlaps at least a part of the fourth side surface 250*d*. For example, the deposition device 700 may include a plurality of second blocking parts 410 under the side surface of the support member 250, and the deposition device 800 may include a second blocking part 415 that is integrally formed under the side surface of the support member 250.

Figure 12:
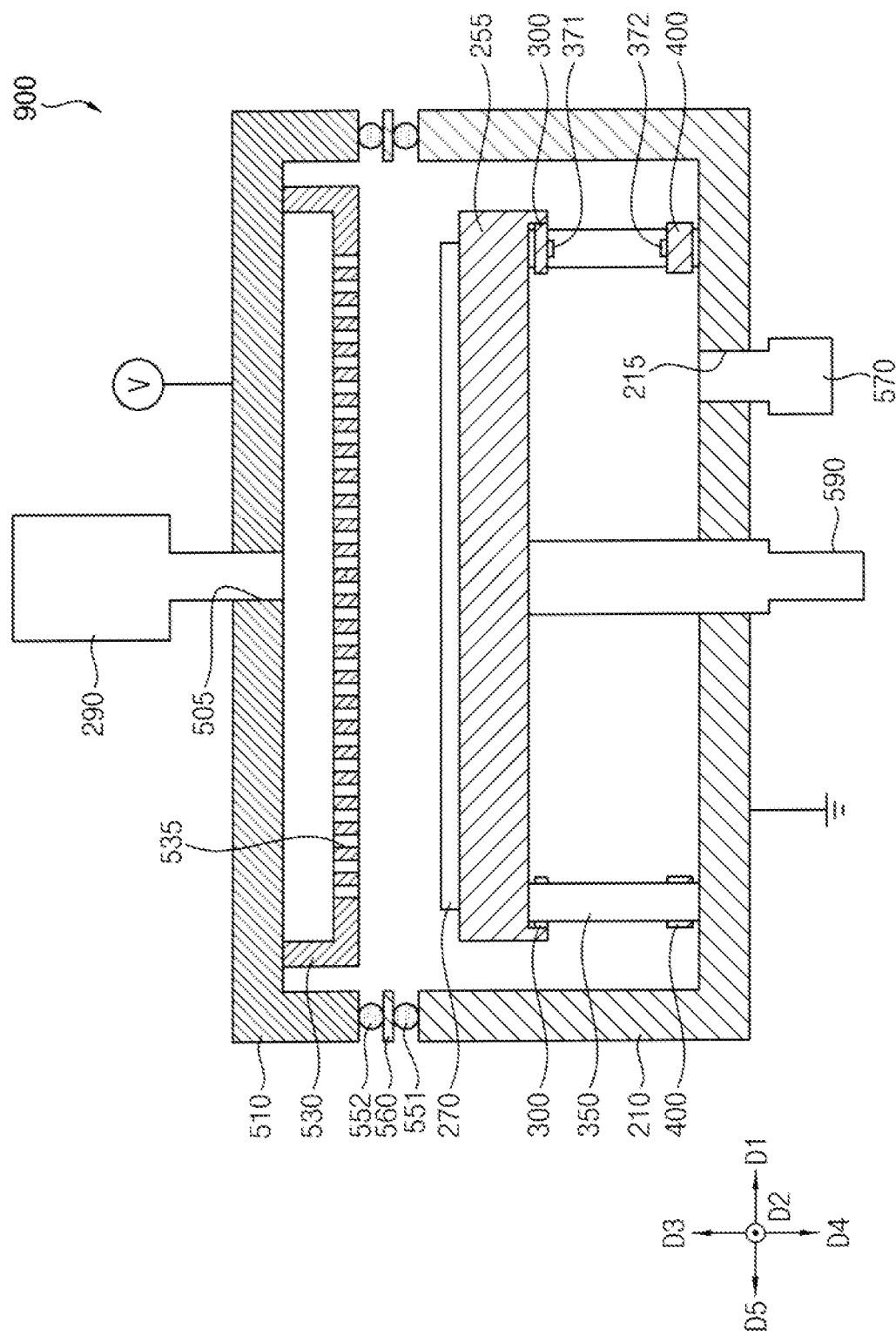
FIG. 12 is a sectional view showing a deposition device according to embodiments of the present invention according to embodiments of the present invention.

FIG. 12 is a sectional view showing a deposition device according to embodiments of the present invention. A deposition device 900 illustrated in FIG. 12 may have a configuration that is substantially identical or similar to the configuration of the deposition device 100 described with reference to FIGS. 1 to 5B except for a support member 255. In FIG. 12, redundant descriptions of components that are substantially identical or similar to the components described with reference to FIGS. 1 to 5B will be omitted.

Referring to FIG. 12, the deposition device 900 may include a chamber 210, a support member 255, a first fixing member 300, a second fixing member 400, a first fixing pin 371, a second fixing pin 372, a ground member 350, a first O-ring 551, a second O-ring 552, an insulating member 560, a suction member 570, a cover member 510, a storage member 290, a distribution member 530, a lifting member 590, and the like. In an embodiment, the chamber 210 may include a lower portion 211 and a side wall 212. The first fixing member 300 may include a first body 320, and the second fixing member 400 may include a second body 420.

When compared with the support member 250 and the first fixing member 300 of FIGS. 1 to 5B, the support member 255 of FIG. 12 may have a protrusion protruding from an outer periphery of the support member 255 in the fourth direction D4, and the first fixing member 300 does not include the first blocking part 310. The protrusion of the support member 255 may serve as the first blocking part 310 of the first fixing member 300.

Figure 13:
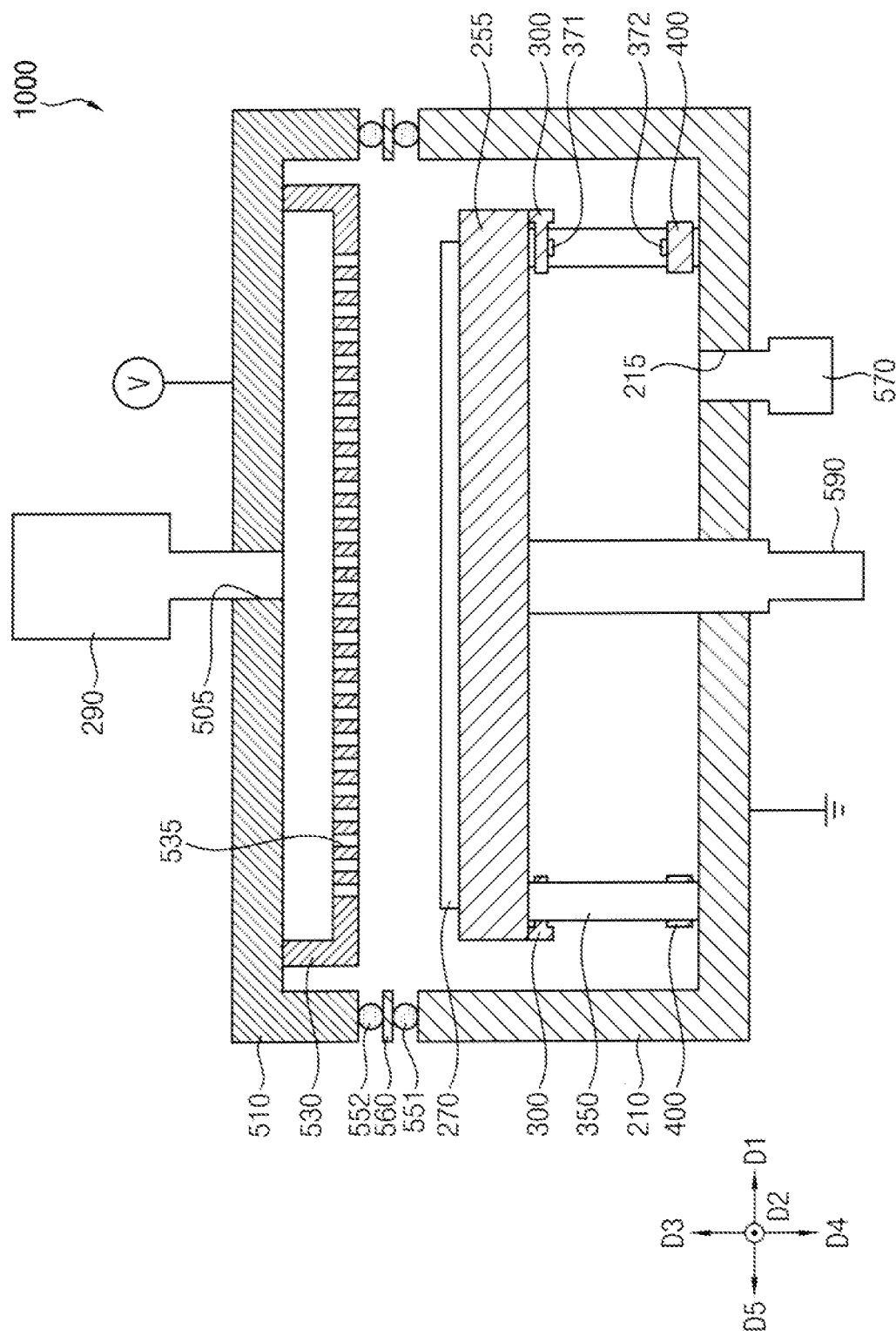
FIG. 13 is a sectional view showing a deposition device according to embodiments of the present invention according to embodiments of the present invention.

FIG. 13 is a sectional view showing a deposition device according to embodiments of the present invention. A deposition device 1000 illustrated in FIG. 13 may have a configuration that is substantially identical or similar to the configuration of the deposition device 100 described with reference to FIGS. 1 to 5B except for a position of the first fixing member 300. In FIG. 13, redundant descriptions of components that are substantially identical or similar to the components described with reference to FIGS. 1 to 5B will be omitted.

Referring to FIG. 13, the deposition device 1000 may include a chamber 210, a support member 250, a first fixing member 300, a second fixing member 400, a first fixing pin 371, a second fixing pin 372, a ground member 350, a first O-ring 551, a second O-ring 552, an insulating member 560, a suction member 570, a cover member 510, a storage member 290, a distribution member 530, a lifting member 590, and the like. In an embodiment, the chamber 210 may include a lower portion 211 and a side wall 212. The first fixing member 300 may include a first blocking part 310 and a first body 320, and the second fixing member 400 may include a second body 420.

When compared with the first fixing member 300 of FIGS. 1 to 5B, an outer peripheral surface of the first fixing member 300 of FIG. 13 (e.g., the outer peripheral surface of the first blocking part 310) may be aligned with the side surface of the support member 250 so that a step is not formed between the side surface of the support member 250 and the outer peripheral surface of the first fixing member 300. Without such step, the cleaning gas may easily move to the lower portion 211 of the chamber 210, and may be sucked into the suction member 570.

The inventive concept may be applied to various deposition devices including a ground member. For example, the inventive concept may be applied to numerous deposition devices such as a deposition device for depositing a silicon-based insulation layer, a deposition device for depositing a silicon-based semiconductor layer, etc.

The foregoing is illustrative of embodiments and is not to be construed as limiting. Although a few embodiments have been described, those skilled in the art will readily appreciate that many modifications are possible in some embodiments without materially departing from the novel teachings and features of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A deposition apparatus comprising:
   a chamber including a lower portion and a side wall;
   a support member located in a space defined by the lower portion of the chamber and the side wall of the chamber, and including a first side surface;
   a ground member disposed between the support member and the lower portion of the chamber; and
   a first fixing member including:
   a first body located under a first end portion of the ground member and including a first side surface, and
   a first blocking part located on the first side surface of the first body and the first side surface of the support member,
   wherein the first end portion of the ground member directly contacts a bottom surface of the support member, and
   wherein the first blocking part extends along the first side surface of the support member, and shields the first end portion of the ground member from view.

2. The deposition apparatus of claim 1, further comprising:
   a first fixing pin passing through the first body of the first fixing member and the first end portion of the ground member to fix the first body of the first fixing member and the first end portion of the ground member to the bottom surface of the support member adjacent to the first side surface of the support member.

3. The deposition apparatus of claim 2,
   wherein the first body of the first fixing member further includes an upper surface having a flat top surface portion and a curved surface portion, which are adjacent to the bottom surface of the support member, and
   wherein the first fixing pin passes through the flat top surface portion of the first body of the first fixing member.

4. The deposition apparatus of claim 3,
   wherein the first end portion of the ground member contacts the upper surface of the first body of the first fixing member, and
   wherein the first blocking part extends beyond the upper surface of the first body to define a space with the bottom surface of the support member and the curved surface portion of the first body so that the space is shielded from the outside of the support member.

5. The deposition apparatus of claim 3, further comprising:
a second fixing member including a second body,
wherein the second body includes a first side surface, and
wherein the second body is located on a second end portions, opposite to the first end portion, of the ground member, and is adjacent to the lower portion of the chamber.

6. The deposition apparatus of claim 5, further comprising:
a second fixing pin passing through the second body of the second fixing member and the second end portion of the ground member to fix the second body of the second fixing member and the second end portion of the ground member to the lower portion of the chamber.

7. The deposition apparatus of claim 5,
wherein the second body of the second fixing member further includes a lower surface having a flat bottom surface portion and a curved surface portion, which are adjacent to the lower portion of the chamber.

8. The deposition apparatus of claim 7,
wherein the ground member has a curved shape between the support member and the lower portion of the chamber, and
wherein the ground member extends along the curved surface portion of the first fixing member and the curved surface portion of the second fixing member.

9. The deposition apparatus of claim 8, further comprising:
a lifting member passing through the lower portion of the chamber,
wherein the lifting member contacts the bottom surface of the support member.

10. The deposition apparatus of claim 9,
wherein a shape of the ground member is configured to change in response to moving of the lifting member in a direction from the lower portion of the chamber to the support member or in a direction from the support member to the lower portion of the chamber.

11. The deposition apparatus of claim 7,
wherein the second fixing member further includes a second blocking part located on the first side surface of the second body, and
wherein the second blocking part extends along the first side surface of the support member to shield the second end portion of the ground member from view.

12. The deposition apparatus of claim 11,
wherein the second end portion of the ground member contacts the second fixing member, and
wherein the second blocking part is configured to shield a space between the lower portion of the chamber and the curved surface portion of the second body from view.

13. The deposition apparatus of claim 5,
wherein the second fixing member is located under the first fixing member and has an upside-down shape of the first fixing member.

14. The deposition apparatus of claim 1,
wherein the support member and the chamber are electrically connected with each other by the ground member.

15. The deposition apparatus of claim 1,
wherein the chamber further includes a through-opening formed in the lower portion.

16. The deposition apparatus of claim 15, further comprising:
a suction member connected to the through-opening formed in the lower portion of the chamber,
wherein the suction member is configured to suck a material located inside the chamber.

17. The deposition apparatus of claim 1, further comprising:
a cover member disposed on the chamber and including a through-opening;
a storage member connected to the through-opening of the cover member; and
a distribution member disposed under the through-opening and including a plurality of openings.

18. The deposition apparatus of claim 17,
wherein the cover member and the distribution member are electrically connected with each other.

19. The deposition apparatus of claim 17,
wherein the cover member is electrically isolated from the chamber.

20. The deposition apparatus of claim 17,
wherein a deposition material stored in the storage member passes through the plurality of openings of the distribution member to be deposited on a substrate located on the support member.

* * * * *